United States Patent [19]
Scott et al.

[11] Patent Number: 5,600,181
[45] Date of Patent: Feb. 4, 1997

[54] HERMETICALLY SEALED HIGH DENSITY MULTI-CHIP PACKAGE

[75] Inventors: Patrick M. Scott, Newark Valley, N.Y.; Andrew Z. Glovatsky, Ypsilanti, Mich.; Michael A. Mele, Endicott, N.Y.

[73] Assignee: Lockheed Martin Corporation, Bethesda, Md.

[21] Appl. No.: 449,591

[22] Filed: May 24, 1995

[51] Int. Cl.$^6$ .................................................. H01L 23/34
[52] U.S. Cl. ........................... 257/723; 257/724; 257/787
[58] Field of Search ................................. 257/787, 723, 257/724, 725, 693

[56] References Cited

U.S. PATENT DOCUMENTS

| | | |
|---|---|---|
| 4,040,874 | 8/1977 | Yerman . |
| 4,477,828 | 10/1984 | Scherer . |
| 4,768,081 | 8/1988 | Moeller . |
| 5,302,553 | 4/1994 | Abbott et al. . |
| 5,332,921 | 7/1994 | Dousen et al. ........................ 257/787 |
| 5,461,545 | 10/1995 | Leroy et al. ........................ 257/787 |

FOREIGN PATENT DOCUMENTS

| | | |
|---|---|---|
| 63-262860 | 10/1988 | Japan . |
| 1-37043 | 2/1989 | Japan . |
| 2-177552 | 7/1990 | Japan . |
| 3-153061 | 7/1991 | Japan . |

*Primary Examiner*—Mahshid Saadat
*Assistant Examiner*—S. V. Clark
*Attorney, Agent, or Firm*—Lane Aitken & McCann

[57] ABSTRACT

An on-board chip package has a hermetically sealed connector mechanically secured to a printed wiring board and electrically connected to input/output pads on the board. Chip dies are mechanically bonded to the board and then individually encapsulated with a suitable potting material. The entire assembly is coated with an encapsulating polymer, which partially overlaps the inboard side of the hermetic connector housing and which provides a relatively smooth, crevice-free outer surface. The entire assembly is then covered, in the preferred embodiment, with a metal layer, to hermetically seal the entire chip-on-board assembly.

8 Claims, 2 Drawing Sheets

HERMETICALLY SEALED HIGH DENSITY MULTI-CHIP PACKAGE

BACKGROUND OF THE INVENTION

1. Field of the Invention

This invention relates to a high density, hermetically sealed, multi-chip package, and more particularly to a hermetically sealed, multi-chip package suitable for military and space applications.

2. Description of the Prior Art

Certain applications, such as military and space applications, require integrated circuit packages to be hermetically sealed by means of glass, or metal, or ceramic, or a combination thereof. In the prior art, each chip is individually encapsulated for such applications. A number of integrated circuit chips are typically mounted on a printed wiring board, which mechanically supports the integrated circuits themselves and provides electrical connections to them.

For commercial applications, the prior art has recognized that integrated circuit chips can be spaced closer to one another on a printed wiring board if the chip die itself is bonded directly to the board; that is, a die without an enclosure or carrier. In this prior art packaging technology, each chip is then encapsulated with an epoxy resin to protect the die and its connecting wires. This packaging technology, known in the art as chip-on-board (COB) technology, allows the chips to be closely spaced from one another on the board, and thus provides a package with a high component density. However, this prior art chip-on-board packaging technology does not provide a hermetic seal for the chips (e.g. semiconductor integrated circuits or hybrid circuits) and therefore has not been adopted for applications where such a hermetic seal is a requirement.

SUMMARY OF THE INVENTION

An object of this invention is the provision of a chip-on-board integrated circuit package that is hermetically sealed.

Briefly, this invention contemplates the provision of a chip-on-board package in which a hermetically sealed connector is mechanically secured to a printed wiring board and electrically connected to input/output pads on the board. Chip dies are mechanically bonded to the board and then individually encapsulated with a suitable potting material. The entire assembly is coated with an encapsulating polymer, which partially overlaps the inboard side of the hermetic connector housing and which provides a relatively smooth, crevice-free outer surface.

The entire assembly is then covered, in the preferred embodiment, with a metal layer, to hermetically seal the entire chip-on-board assembly. Here it should be noted that the metal layer provides protection from moisture that is orders of magnitude better than the protection provided by glasses and organic materials.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
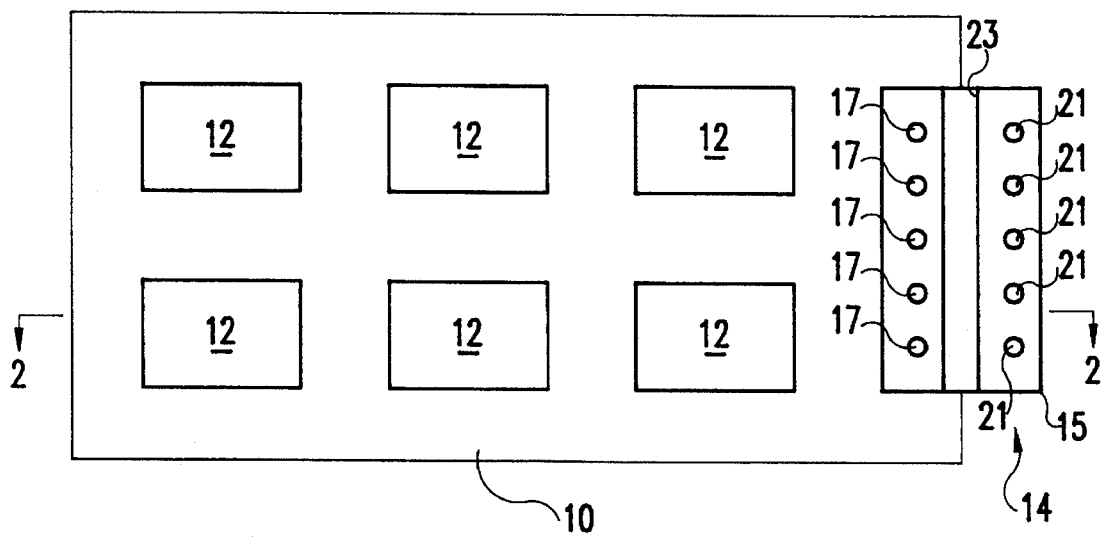
FIG. 1 is a plan view of a chip-on-board assembly at a manufacturing process state where chip dies have been electrically and mechanically connected to a printed wiring board and a hermetically sealed connector has been connected to the board along one of its edges.
Figure 2:
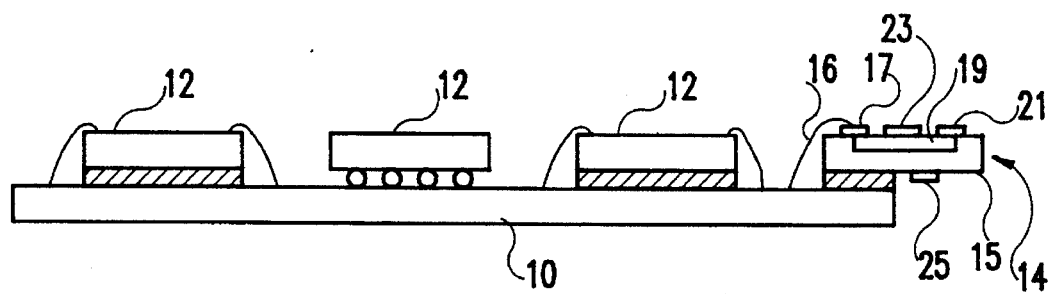
FIG. 2 is a sectional side view along the parting line 2—2 of FIG. 1.

Referring now to FIGS. 1 and 2, a printed wiring board 10 has a number of chip dies 12 bonded to its upper surface. Typically, the chips may include commercially available silicon integrated circuit chip dies, but special integrated circuit chip dies and hybrid chip dies may also be included in a package. The chip dies 12 are affixed directly to the board 10. Any suitable prior art bonding technology may be used; they may be adhesively (e.g. epoxy) bonded to the board with wire bond connections between the board and the printed wiring and solder bump technology may also be used. In this embodiment of the invention, a hermetically sealed connector, indicated by the general reference number 14, is epoxy bonded to the input/output end of the printed wiring board 10. Leads 16 connect inboard pads 17 on connector 14 to contact pads (not shown) on the board. Leads 19, which are hermetically sealed in a ceramic body 15, connect the inboard pads 17 to a set of outboard pads 21. A conductive strip 23 bonded to the top of the ceramic body 15 and a similar conductive strip 25 bonded to the bottom provide surfaces to which the metal layer will bond to form a hermetic seal.

Figure 3:
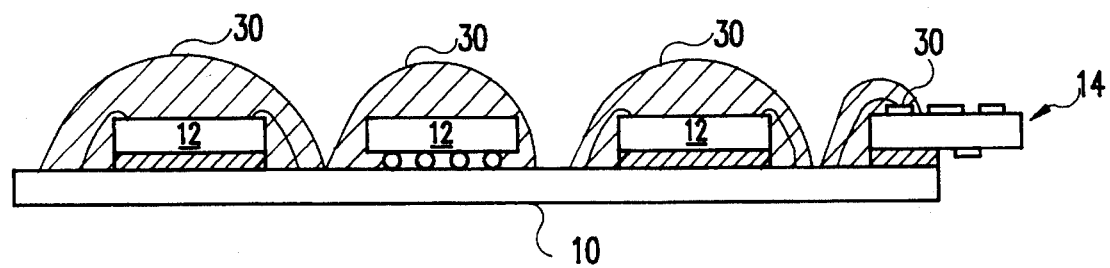
FIG. 3 is a side sectional view of the assembly in FIG. 2 at a state where chips on the board have been initially potted.

Referring now to FIG. 3, in the next step, the chip dies 12 are initially encapsulated with a potting material 30 to provide support to the chip dies and their connecting leads. An epoxy material is suitable for this purpose.

Figure 4:
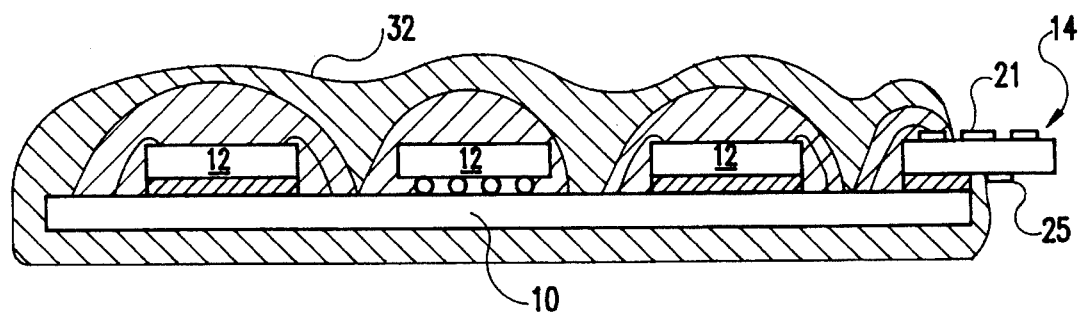
FIG. 4 is a side sectional view of the assembly in FIG. 3 at a state where the entire assembly has been encapsulated.

Referring now to FIG. 4, the entire assembly is encapsulated with a layer 32 of suitable material to provide a smooth, crevice-free surface. The encapsulating layer 32 overlaps a portion of the connector 14 inboard of the strips 23 and 25, as shown. The encapsulating layer 32 preferably is a soluble polymer such as an acrylic polymer to allow the assembly to be reworked in the event of a problem with a component or its connection. The encapsulating layer may be applied to the assembly by immersing the assembly in a mold filled with the encapsulating layer in a liquid state. It is important that the material completely encapsulate the assembly (i.e. top, bottom, and sides) and partially overlap the connector 14.

Figure 5:
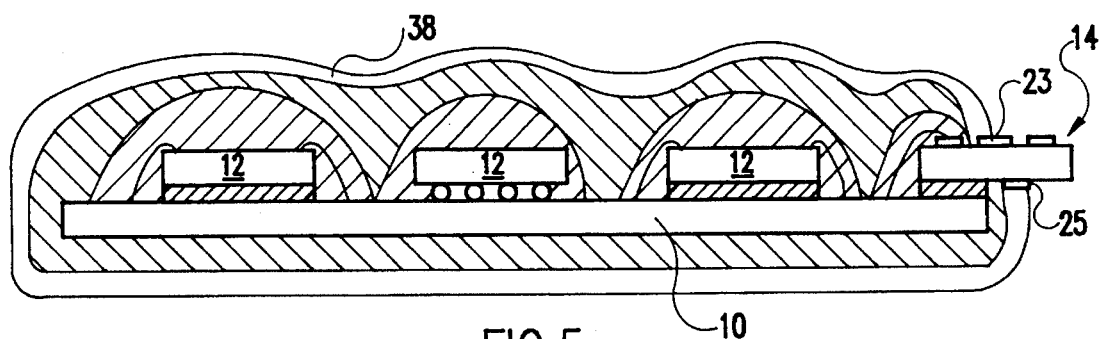
FIG. 5 is a side sectional view of the assembly in FIG. 4 at a state where the hermetic sealing layer has been deposited.

Referring now to FIG. 5, the outboard contact pads 21 of the connector 14 are coated with a masking material (not shown), and the entire assembly is then covered with a metal layer 38. The metal layer 38 may be a composite layer with a layer of copper first sputtered on to the surface of the encapsulating layer 32 followed by a layer of chrome, which can be electro- or electroless-deposited on top of the copper layer. The metal layer 38 completely covers the assembly and bonds to the strips 23 and 25 to provide a hermetically sealed chip-on-board assembly. The masking material is removed from the outboard portion of the connector.

Figure 6:
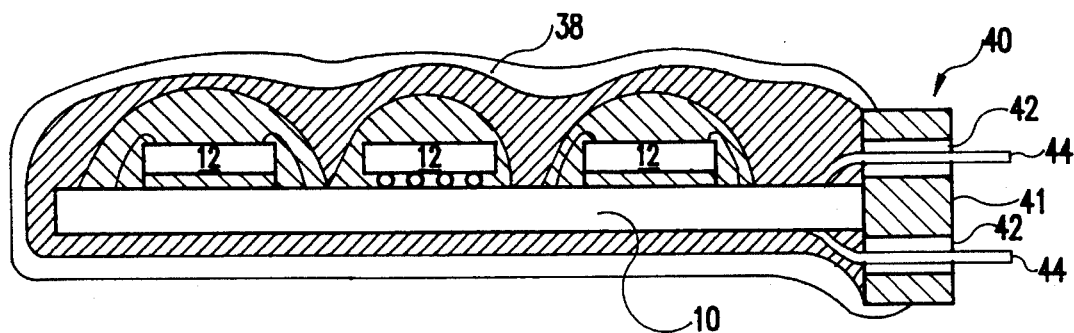
FIG. 6 is a side sectional view, similar to the view in FIG. 5, of a hermetically sealed chip-on-board package in accordance with the teachings of the invention but with an alternate type of hermetic connector.

FIG. 6 shows an alternative form of the invention in which a commercial glass seal hermetic connector 40 is used in lieu of ceramic connector 14. A metallic housing 41 of the connector is bonded to the end of the board 10. Glass bonds 42 secure conductors 44 in the housing 41 and provide a hermetic seal between the inboard and outboard sides of the conductors.

While the invention has been described in terms of a single preferred embodiment, those skilled in the art will recognize that the invention can be practiced with modification within the spirit and scope of the appended claims.

Having thus described our invention, what we claim as new and desire to secure by letters patent is as follows:

1. A hermetically sealed printed wiring board assembly, comprising in combination:

a printed wiring board;

a plurality of circuit dies mechanically bonded to said printed wiring board;

a hermetically sealed input/output connector connected to said printed wiring board;

an encapsulating layer completely encapsulating said printed circuit board, said plurality of circuit dies, and an inboard portion of said connector;

a metal layer covering said non-metallic encapsulating layer to provide a hermetic seal that completely encloses said printed wiring board, said plurality of circuit dies, and said inboard portion of said connector.

2. A hermetically sealed printed wiring board assembly as in claim 1 wherein said encapsulating layer includes a soluble polymer.

3. A hermetically sealed printed wiring board assembly as in claim 1 wherein said encapsulating layer provides a smooth, crevice-free surface.

4. A hermetically sealed printed wiring board assembly as in claim 3 wherein said encapsulating layer includes a soluble polymer.

5. A hermetically sealed printed wiring board assembly as in claim 1 wherein said metal layer is comprised of a first metal layer deposited by a vacuum deposition process onto the surface of said encapsulating layer and a second metal layer deposited onto the surface of said first metal layer by an electro- or electroless-deposition process.

6. A hermetically sealed printed wiring board assembly, comprising in combination:

a printed wiring board;

a plurality of circuit dies mechanically bonded to said printed wiring board;

a hermetically sealed input/output connector connected to said printed wiring board;

an encapsulating layer completely encapsulating said printed circuit board, said plurality of circuit dies, and an inboard portion of said connector;

a metal layer covering said non-metallic encapsulating layer to provide a hermetic seal that completely encloses said printed wiring board, said plurality of circuit dies, and said inboard portion of said connector;

said hermetically sealed input/output connector being comprised of a ceramic body bonded to said printed wiring board with connection pads to said printed wiring board along an inboard edge of said ceramic body, connection pads along an outboard edge of said ceramic body, and a metal strip on an upper and a lower surface of said ceramic body intermediate said inboard edge and said outboard edge to which said metal layer is bonded.

7. A hermetically sealed printed wiring board assembly, comprising in combination:

a printed wiring board;

a plurality of circuit dies mechanically bonded to said printed wiring board;

a hermetically sealed input/output connector connected to said printed wiring board;

an encapsulating layer completely encapsulating said printed circuit board, said plurality of circuit dies, and an inboard portion of said connector;

a metal layer covering said non-metallic encapsulating layer to provide a hermetic seal that completely encloses said printed wiring board, said plurality of circuit dies, and said inboard portion of said connector, said metal layer being comprised of a first metal layer deposited by a vacuum deposition process onto the surface of said encapsulating layer and a second metal layer deposited onto the surface of said first metal layer by an electro- or electroless-deposition process; and said hermetically sealed input/output connector being comprised of a ceramic body bonded to said printed wiring board with connection pads to said printed wiring board along an inboard edge of said ceramic body, connection pads along an outboard edge of said ceramic body, and a metal strip on an upper and a lower surface of said ceramic body intermediate said inboard edge and said outboard edge to which said metal layer is bonded.

8. A hermetically sealed printed wiring board assembly as in claim 1 wherein said hermetically sealed input/output connector is comprised of a metallic body bonded to said printed wiring board and glass bonds securing a plurality of conductors in said metallic body and insulated therefrom.

* * * * *